US011646706B2

(12) United States Patent
Hwu

(10) Patent No.: US 11,646,706 B2
(45) Date of Patent: May 9, 2023

(54) COMMON-SOURCE DIFFERENTIAL POWER AMPLIFIER AND ELECTRONIC DEVICE INCLUDING THE SAME

(71) Applicant: HANGZHOU GEO-CHIP TECHNOLOGY CO., LTD., Hangzhou (CN)

(72) Inventor: Sy-Chyuan Hwu, Hangzhou (CN)

(73) Assignee: Hangzhou Geo-chip Technology Co., Ltd., Hangzhou (CN)

( * ) Notice: Subject to any disclaimer, the term of this patent is extended or adjusted under 35 U.S.C. 154(b) by 86 days.

(21) Appl. No.: 17/405,226

(22) Filed: Aug. 18, 2021

(65) Prior Publication Data

US 2023/0055228 A1 Feb. 23, 2023

(51) Int. Cl.
*H03F 3/45* (2006.01)
*H03F 1/02* (2006.01)
*H03F 3/21* (2006.01)

(52) U.S. Cl.
CPC ....... *H03F 3/45269* (2013.01); *H03F 1/0211* (2013.01); *H03F 3/21* (2013.01); *H03F 2203/45471* (2013.01)

(58) Field of Classification Search
CPC .................................................. H03F 3/45269
See application file for complete search history.

(56) References Cited

U.S. PATENT DOCUMENTS

| | | | | |
|---|---|---|---|---|
| 6,114,907 A | * | 9/2000 | Sakurai ............... | H03F 3/45076 330/253 |
| 2001/0007443 A1 | * | 7/2001 | Ono ..................... | H03K 5/2418 341/159 |
| 2006/0244710 A1 | * | 11/2006 | Iriguchi ............... | G09G 3/3266 345/100 |
| 2006/0284670 A1 | * | 12/2006 | Eid ..................... | H03F 3/45183 327/563 |
| 2009/0051440 A1 | * | 2/2009 | Kim ..................... | H03H 11/32 330/301 |
| 2011/0102058 A1 | * | 5/2011 | Conte .................. | H03F 3/45183 330/296 |

\* cited by examiner

Primary Examiner — Patricia T Nguyen
(74) Attorney, Agent, or Firm — Nixon & Vanderhye P.C.

(57) ABSTRACT

A common-source differential power amplifier comprises a compensation circuit, which comprises a first and a second compensation transistors and two signal terminals, a source and a drain of the first compensation transistor are short-circuited and connected to a gate of the second compensation transistor and one signal terminal of the compensation circuit, the source and the drain of the second compensation transistor are short-circuited and connected to the gate of the first compensation transistor and the other signal terminal of the compensation circuit, the two signal terminals of the compensation circuit are further respectively connected to two differential signal input terminals of the common-source differential power amplifier directly or via a capacitor, where the first and second compensation transistors in the same compensation circuit are both NMOS transistors or both PMOS transistors. An electronic device including the power amplifier is also disclosed.

11 Claims, 4 Drawing Sheets

COMMON-SOURCE DIFFERENTIAL POWER AMPLIFIER AND ELECTRONIC DEVICE INCLUDING THE SAME

TECHNICAL FIELD

The present disclosure relates to the technical field of analog circuits, and in particular, to a common-source differential power amplifier and an electronic device including the same.

TECHNICAL BACKGROUND

Ideally, even if the input signal power of a differential power amplifier increases, the phase offset of the output signal of the differential power amplifier should be constant. However, in practice, as the input signal power of the differential power amplifier increases, the phase offset of the output signal of the differential power amplifier is increased, resulting in phase distortion of the output signal.

SUMMARY OF THE INVENTION

The purpose of the present disclosure is to provide a common-source differential power amplifier for solving the defects of the prior art.

In order to solve the above technical problems, the present disclosure provides a technical solution in which a common-source differential power amplifier includes at least one compensation circuit and at least one pair of driving transistors; where the same pair of driving transistors from the at least one pair of driving transistors are both NMOS transistors or both PMOS transistors, potentials of sources of the same pair of driving transistors are equal, and rains of the same pair of driving transistors are respectively connected to differential signal output terminals of the differential power amplifier, the compensation circuit includes a first compensation transistor, a second compensation transistor and two signal terminals, where a source and a drain of the first compensation transistor are short-circuited and connected to a gate of the second compensation transistor and one of the two signal terminals of the compensation circuit, and a source and a drain of the second compensation transistor are short-circuited and connected to a gate of the first compensation transistor and the other of the two signal terminals of the compensation circuit; the two signal terminals of the compensation circuit are respectively connected to the two differential signal input terminals of the common-source differential power amplifier directly or through a capacitor, where the first compensation transistor and the second compensation transistor in the same compensation circuit are both NMOS transistors or both PMOS transistors.

The present disclosure further provides a technical solution in which an electronic device includes the above common-source differential power amplifier.

Compared with the prior art, the technical effect of the present disclosure is that, as the input signal power of the common-source differential power amplifier increases, sizes of the gate-source parasitic capacitance and the gate-drain parasitic capacitance of the driving transistor are increasingly raised. Further, each of the first compensation transistor and the second compensation transistor constitutes a capacitor. As the input signal power of the common-source differential power amplifier increases, the capacitance value of the first compensation transistor and the second compensation transistor connected in parallel decreases. By adjusting the parameters (e.g., doping concentration, size, etc.) of each compensation transistor, the input capacitance of the two differential signal input terminals of the differential power amplifier can be kept at a constant value or close to a constant value as the input signal power of the common-source differential power amplifier increases, thereby suppressing the phase distortion of the output signal of the common-source differential power amplifier.

DETAILED DESCRIPTION OF THE EMBODIMENTS

In the present disclosure, it should be understood that terms such as "including" and "having" indicate the presence of a feature, a number, a step, an operation, a component, a part or any combination thereof as described in the specification, but do not exclude a possibility of the presence of one or more other features, numbers, steps, operations, components, parts or combinations thereof.

In addition, it should be noted that the embodiments in the disclosure and the features in the embodiments can be combined with each other if there is no conflict. Hereinafter, the present disclosure will be described in detail with reference to the accompanying drawings and in conjunction with the embodiments.

The present disclosure will be further described below in conjunction with the embodiments shown in the figures.

Figure 1:
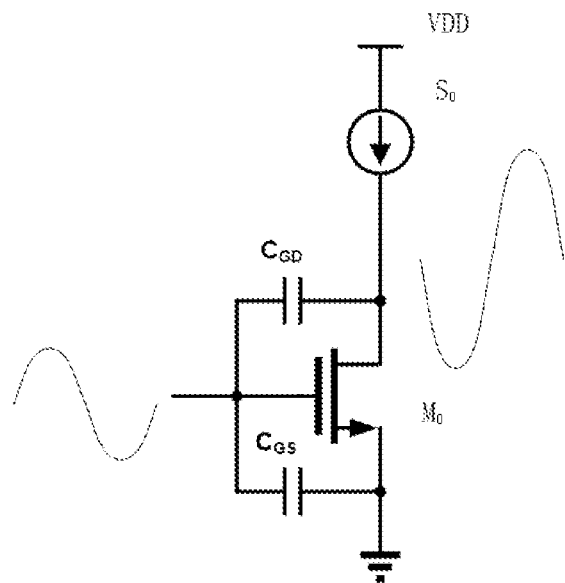
FIG. 1 is a schematic diagram of the circuit structure of a conventional amplifier.

Referring to FIG. 1, in a conventional common-source power amplifier, an NMOS (N-channel metal oxide semiconductor) transistor serves as a driving transistor $M_0$, a current source $S_0$ is connected between a power supply VDD and a drain of the driving transistor $M_0$ to determine the DC (Direct Current) bias state of the driving transistor $M_0$. The gate-source parasitic capacitance $C_{GS}$ and the gate-drain parasitic capacitance $C_{GD}$ of the driving transistor $M_0$ may affect the input capacitance of the common-source power amplifier. The larger the input capacitance of the common-source power amplifier, the longer the signal delay and the larger the signal phase delay.

The gate-source parasitic capacitance $C_{GS}$ of the driving transistor $M_0$ is not a constant value and is relevant to the gate-source voltage $V_{GS}$. The gate-drain parasitic capacitance $C_{GD}$ of the driving transistor $M_0$ is not a constant value and is relevant to the gate-drain voltage $V_{GD}$. The relationships between $C_{GD}$ and $V_{GD}$ and between $C_{GS}$ and $V_{GS}$ can be expressed according to the following equations:

$$C_{GD} = C_{GD0} C_{GD1} * V_{GD} + C_{G02} * V_{GD}^2 + \ldots ;$$

$$C_{GS} C_{GS0} + C_{GS1} * V_{GS} C_{GS2} * V_{GS}^2 + \ldots .$$

Here, $C_{DG0}$, $C_{GD1}$, $C_{GD2}$, $C_{GS0}$, $C_{GS1}$, $C_{GS2}$ are constant values.

As the variation amplitude of the input signal of common-source differential power amplifier increases, the variation amplitudes of the gate-source parasitic capacitance $C_{GS}$ and the gate-drain parasitic capacitance $C_{GD}$ of the driving transistor $M_0$ also increase significantly, which may cause phase distortion of the output signal.

Based on the above analysis, an embodiment of the present disclosure provides a common-source differential power amplifier, including: at least one compensation circuit and at least one pair of driving transistors; the same pair of driving transistors from the at least one pair of driving transistors are both NMOS transistors or both PMOS transistors, the potentials of the sources of the same pair of driving transistors are equal, and each of the drains of the same pair of driving transistors are respectively connected to a differential signal output terminal; the compensation circuit includes a first compensation transistor, a second compensation transistor and two signal terminals, where the source and the drain of the first compensation transistor are short-circuited and connected to the gate of the second compensation transistor and one signal terminal of the compensation circuit, and the source and the drain of the second compensation transistor are short-circuited and connected to the gate of the first compensation transistor and the other signal terminal of the compensation circuit; and the two signal terminals of the compensation circuit are respectively connected to the two differential signal input terminals of the common-source differential power amplifier directly or through a capacitor, where the first compensation transistor and the second compensation transistor in the same compensation circuit are both NMOS transistors or both PMOS transistors (i.e. the same polarity).

As the input signal power of the common-source power amplifier increases, the increasing amplitudes of the gate-source parasitic capacitance and the gate-drain parasitic capacitance of the driving transistor become larger. Each of the first compensation transistor and the second compensation transistor constitutes a capacitor. As the input signal power of the common-source differential power amplifier increases, the capacitance value of the first compensation transistor and the second compensation transistor connected in parallel decreases. By adjusting the parameters (e.g., doping concentration, size, etc.) of each transistor, the input capacitance of the two differential signal input terminals can be kept at a constant value or close to a constant value as the input signal power of the common-source differential power amplifier increases, thereby suppressing the phase distortion of the output signal of the common-source differential power amplifier.

Figure 2:
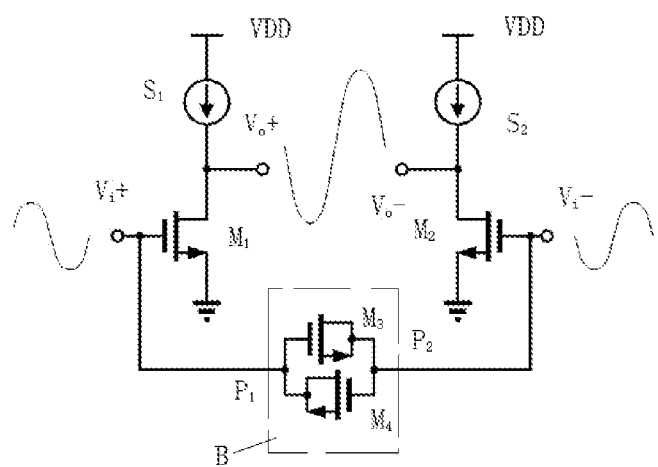
FIGS. 2 to 8 are schematic diagrams of the structure of a common-source differential power amplifier according to an embodiment of the present disclosure.

For example, referring to FIG. 2, the common-source differential power amplifier includes a first driving transistor $M_1$, a second driving transistor $M_2$, a first compensation transistor $M_3$, a second compensation transistor $M_4$, a first bias circuit, and a second bias circuit.

The gate of the first driving transistor $M_1$ and the gate of the second driving transistor $M_2$ are connected to differential signal input terminals $V_i+$, $V_i-$, respectively, both of the source of the first driving transistor $M_1$ and the source of the second driving transistor $M_2$ are grounded, and the drains of the first driving transistor $M_1$ and the second driving transistor $M_2$ are connected to differential signal output terminals $V_o+$ and $V_o-$, respectively.

The first bias circuit (specifically, the current source S1) is configured to determine the DC bias state of the first driving transistor $M_1$, and the second bias circuit (specifically, the current source S2) is configured to determine the DC bias state of the second driving transistor $M_2$.

The first compensation transistor $M_3$ and the second compensation transistor $M_4$ constitute a compensation circuit B. The gate of the first compensation transistor $M_3$, the source of the second compensation transistor $M_4$, and the drain of the second compensation transistor $M_4$ are connected together and connected to the gate of the first driving transistor $M_1$ through a signal terminal $P_1$. The gate of the second compensation transistor $M_4$, the source of the first compensation transistor $M_3$, and the drain of the first compensation transistor $M_3$ are connected together and connected to the gate of the second driving transistor $M_2$ through a signal terminal $P_2$.

Specifically, the first driving transistor $M_1$ and the second driving transistor $M_2$ are both NMOS transistors, and the first compensation transistor $M_3$ and the second compensation transistor $M_4$ are both NMOS transistors.

In other embodiments, the first driving transistor and the second driving transistor are both PMOS (P-channel metal oxide semiconductor) transistors. Accordingly, the sources of the first driving transistor and the second driving transistor can be connected to a power supply terminal instead of being grounded.

In other embodiments, the first compensation transistor and the second compensation transistor are both PMOS transistors.

It should be noted that the first compensation transistor and the second compensation transistor should be of the same parameter. For example, the shape and size of the mask used in manufacturing the first compensation transistor and the second compensation transistor are the same, and the process parameters are also the same. The compensation circuit including the first compensation transistor and the second compensation transistor is symmetrical, so that the circuit structure connected by the first driving transistor and the second driving transistor is symmetrical. That is, the entire common-source differential power amplifier is symmetrical.

Alternatively, each of the first bias circuit and the second bias circuit includes a current source (i.e., current sources S1 and S2 in FIG. 2). In the present disclosure, the specific forms of the first bias circuit and the second bias circuit are not limited. For example, each of the first bias circuit and the second bias circuit includes a resistor. That is, the drain of the first driving transistor is connected to a power supply terminal through a resistor or grounded through a resistor.

In the above embodiments, there is only one driving transistor in the one side circuit of the common-source differential power amplifier. Also, the circuit on one side of the common-source differential power amplifier can be a compensation structure (CMOS structure).

That is, in some embodiments, the common-source differential power amplifier includes a first driving transistor, a second driving transistor, a third driving transistor, a fourth driving transistor and at least one compensation circuit, where both of the first driving transistor and the third driving transistor are disposed on one side of the compensation circuit, and both of the second driving transistor and the fourth pressing driving transistor are disposed on the other side of the compensation circuit.

The gates of the first and second driving transistors are respectively connected to the two differential signal input terminals of the common-source differential power amplifier directly or through a capacitor, both of the sources of the first and second driving transistors are grounded, the drains of the first and second driving transistors are connected to the two differential signal output terminals of the common-source differential power amplifier respectively, and the first and second driving transistors may be both NMOS transistors.

The gates of the third and fourth driving transistors are respectively connected to the two differential signal input terminals of the common-source differential power amplifier directly or through a capacitor, both of the sources of the third and fourth driving transistors are connected to the power supply terminal, the drains of the third and fourth driving transistors are connected to the two differential signal output terminals of the common-source differential power amplifier, respectively, and both of the third and fourth driving transistors may be PMOS transistors.

The compensation circuit includes a first compensation transistor, a second compensation transistor and two signal terminals, where the source and the drain of the first compensation transistor are short-circuited and connected to the gate of the second compensation transistor and one signal terminal of the compensation circuit, and the source and the drain of the second compensation transistor are short-circuited and connected to the gate of the first compensation transistor and the other signal terminal of the compensation circuit.

The two signal terminals of the compensation circuit are connected respectively to the two differential signal input terminals of the common-source differential power amplifier directly or through a capacitor.

Here, the first compensation transistor and the second compensation transistor in the same compensation circuit are both NMOS transistors or both PMOS transistors (i.e. of the same polarity).

The principle of the compensation circuit for suppressing the phase distortion of the common-source differential power amplifier is the same as the operating principle of the above embodiments. That is, as the input signal power of the common-source differential power amplifier increases, the increasing amplitudes of the gate-source parasitic capacitance and gate-drain parasitic capacitance of the driving transistor connected or coupled to the differential signal input terminal become larger, the decreasing amplitude of the capacitance between the two signal terminals of the compensation circuit tends becomes larger, and such increase and decrease cancel each other out.

Figure 3:
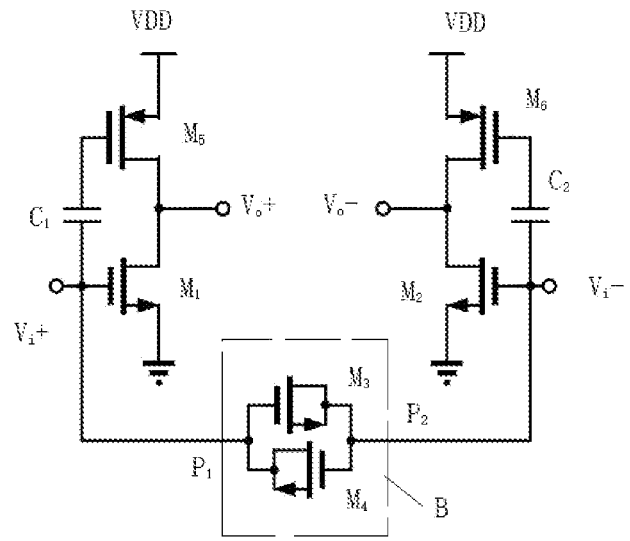

For example, in the common-source differential power amplifier shown in FIG. 3, the gate of a third driving transistor $M_5$ is coupled to a differential signal input terminal $V_i+$ through a first capacitor $C_1$, and the gate of a fourth driving transistor $M_6$ is coupled to the other differential signal input terminal $V_i-$ through a second capacitor $C_2$.

The illustrated common-source differential power amplifier is provided with only one compensation circuit B, and the DC operating point of the gate voltage of each driving transistor of the differential power amplifier can be independently designed.

Figure 4:
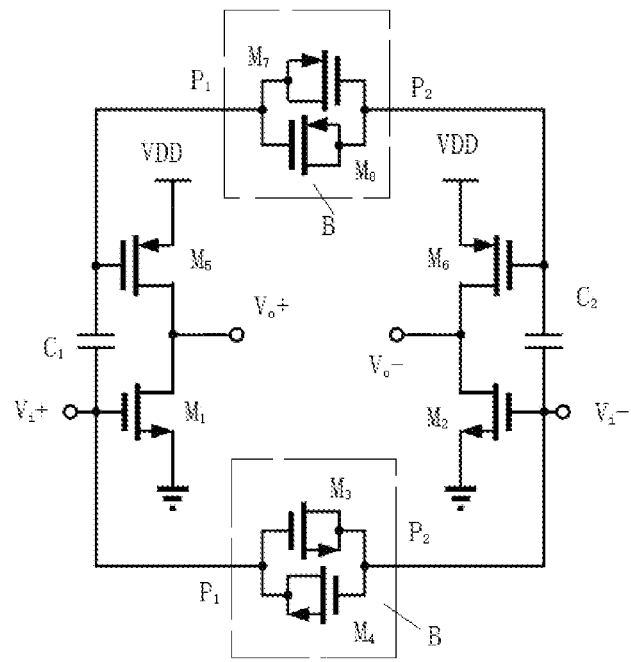

For example, in the common-source differential power amplifier shown in FIG. 4, an additional compensation circuit B is added to the circuit in FIG. 3. The added compensation circuit B includes a first compensation transistor $M_7$ and a second compensation transistor $M_8$. The added compensation circuit is connected between the gate of a third driving transistor $M_5$ and the gate of a fourth driving transistor $M_6$.

Figure 5:
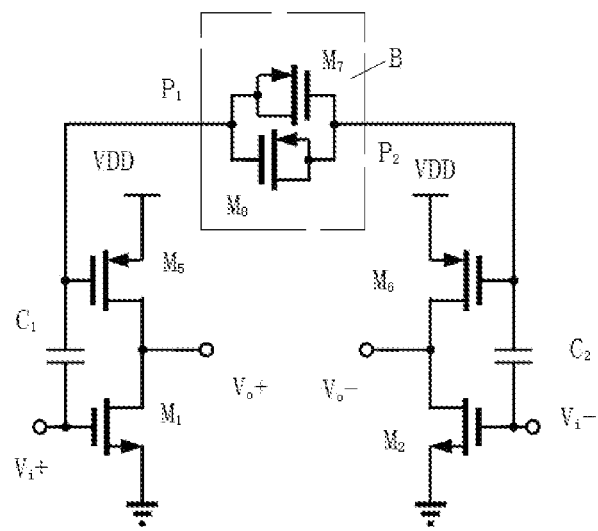

For example, in the common-source differential power amplifier shown in FIG. 5, unlike the circuit in FIG. 3, the compensation circuit B is coupled to the two differential signal input terminals $V_i+$ and $V_i-$ through the respective capacitors. Specifically, the compensation circuit B is connected between the gate of a third driving transistor $M_5$ and the gate of a fourth driving transistor $M_6$.

Figure 6:
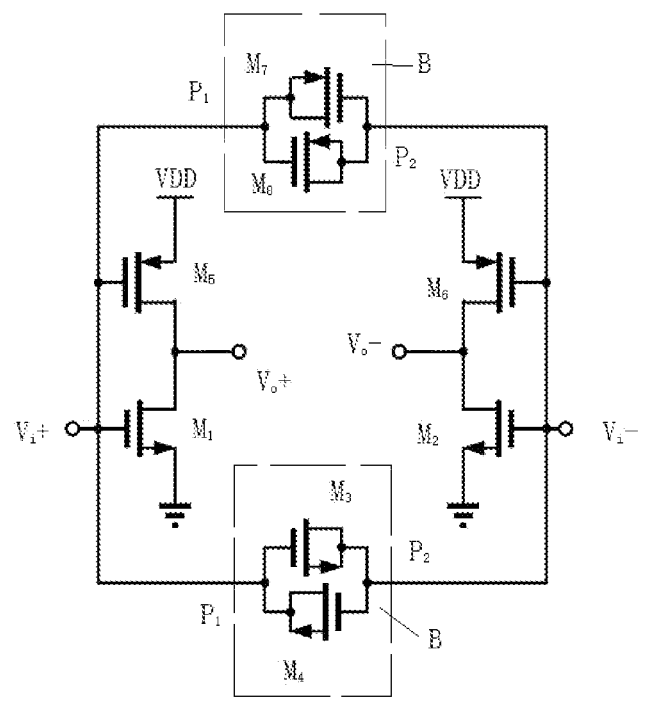

In another embodiment, in the common-source differential power amplifier shown in FIG. 6, unlike the circuit in FIG. 3, the gate of a first driving transistor $M_1$ and the gate of a third driving transistor $M_5$ are directly connected to a differential signal input terminal $V_i+$, and the gate of a second driving transistor $M_2$ and the gate of a fourth driving transistor $M_6$ are directly connected to another differential signal input terminal $V_i-$.

In order to maintain the symmetry of the common-source differential power amplifier, the first compensation transistor and the second compensation transistor in the same compensation circuit can be both NMOS transistors or both PMOS transistors, and the first compensation transistor and the second compensation transistor in the same compensation circuit can be of the same parameter.

In some embodiments, if the two signal terminals of the compensation circuit are respectively coupled to the two differential signal input terminals of the common-source differential power amplifier through a capacitor, each of the two signal terminals of the compensation circuit is connected to a bias voltage terminal through a resistor.

The bias voltage terminal is configured to provide an adjustable constant voltage. The compensation circuit may be equivalent to a capacitor, and both signal terminals of the compensation circuit are connected to the bias voltage terminal through the respective resistors. The capacitor and the two resistors form a high-pass filter, allowing high-frequency voltage signals to pass through the two signal terminals of the compensation circuit. For medium and low frequency signals, the potentials at both ends of the capacitor are almost equal. The resistance values of the two resistors should be set relatively large. By changing the voltage of the bias voltage terminal, the equivalent capacitor can have different capacitance characteristics, so that the circuit adjustment becomes more flexible.

Figure 7:
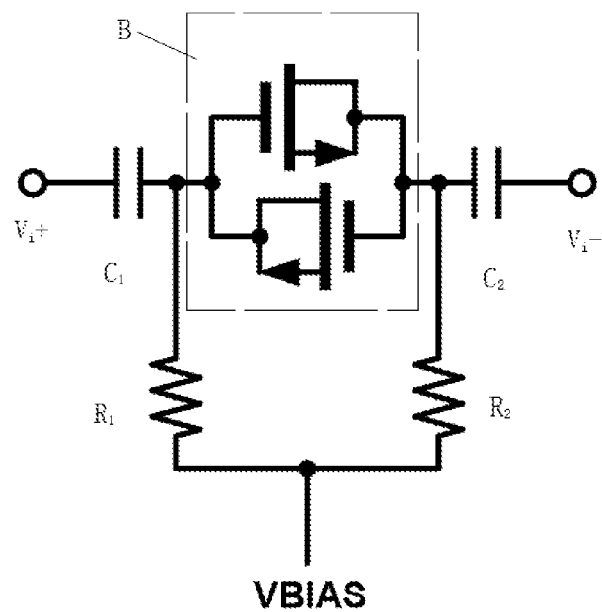
Figure 8:
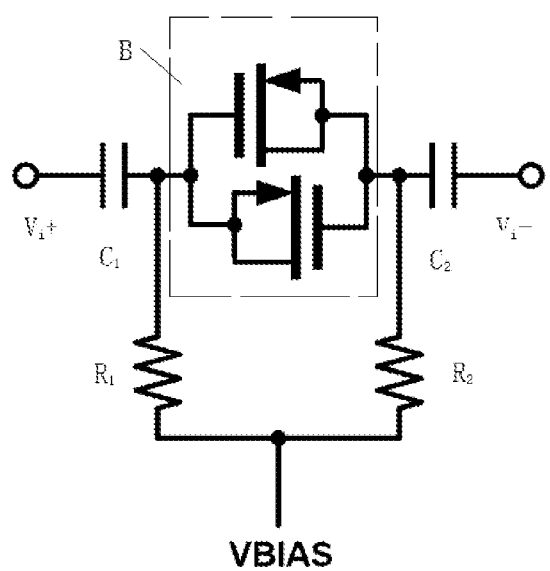

Specifically, FIG. 7 and FIG. 8 only illustrate two differential signal input terminals $V_i+$ and $V_i-$ of a common-source differential power amplifier, and the internal structure of the common-source differential power amplifier can be designed according to the prior art.

The compensation transistor in the compensation circuit B in FIG. 7 is an NMOS transistor, and the compensation transistor in the compensation circuit B in FIG. 8 is a PMOS transistor. One signal terminal of the compensation circuit B is connected to a bias voltage terminal VBIAS through a resistor $R_1$, and the other signal terminal of the compensation circuit B is connected to the bias voltage terminal VBIAS through a resistor $R_2$.

The embodiment of the present disclosure also provides an electronic device including the common-source differential power amplifier described in the foregoing embodiment. The common-source differential power amplifier is, for example, configured to drive an antenna, and the electronic device is, for example, a mobile phone or a smart watch that can transmit antenna signals.

The various embodiments in the present disclosure are described in a progressive manner, and the same or similar parts between the various embodiments can be referred to each other, and each embodiment focuses on the differences from other embodiments.

The protection scope of the present disclosure is not limited to the above embodiments. It is obvious that, those skilled in the art can make various amendments and modifications to the present disclosure without departing from the scope and spirit of the present disclosure. If these amendments and modifications fall within the scope of the claims of the present disclosure and its equivalent technology, the present disclosure is also intended to include these amendments and modifications.

What is claimed is:

1. A common-source differential power amplifier comprising at least one compensation circuit and at least one pair of driving transistors, wherein, the same pair of driving transistors from the at least one pair of driving transistors are both NMOS transistors or both PMOS transistors, potentials of sources of the same pair of driving transistors are equal, and drains of the same pair of driving transistors are connected to differential signal output terminals of the differential power amplifier, respectively;

the compensation circuit comprises a first compensation transistor, a second compensation transistor and two signal terminals, wherein, a source and a drain of the first compensation transistor are short-circuited and connected to a gate of the second compensation transistor and one of the signal terminals of the compensation circuit, and a source and a drain of the second compensation transistor are short-circuited and connected to a gate of the first compensation transistor and the other of the signal terminals of the compensation circuit;

the two signal terminals of the compensation circuit are respectively connected to two differential signal input terminals of the common-source differential power amplifier directly or through a capacitor, wherein, the first compensation transistor and the second compensation transistor in the same compensation circuit are both NMOS transistors or both PMOS transistors.

2. The common-source differential power amplifier of claim 1, further comprising a first bias circuit and a second bias circuit, wherein the at least one pair of driving transistors comprise a first driving transistor and a second driving transistor, a gate of the first driving transistor and a gate of the second driving transistor are respectively connected to the two differential signal input terminals of the common-source differential power amplifier, both of a source of the first driving transistor and a source of the second driving transistor are grounded or connected to a power supply terminal, and drains of the first driving transistor and the second driving transistor are respectively connected to the two differential signal output terminals of the common-source differential power amplifier, the first bias circuit is configured to determine a DC bias state of the first driving transistor, and the second bias circuit is configured to determine a DC bias state of the second driving transistor, the two signal terminals of the compensation circuit are respectively connected to the gate of the first driving transistor and the gate of the second driving transistor, and wherein, the first driving transistor and the second driving transistor are both NMOS transistors or both PMOS transistors, and the first compensation transistor and the second compensation transistor are both NMOS transistors or both PMOS transistors.

3. The common-source differential power amplifier of claim 2, wherein the first driving transistor and the second driving transistor are both NMOS transistors or both PMOS transistors.

4. The common-source differential power amplifier of claim 2, wherein the first compensation transistor and the second compensation transistor are both NMOS transistors or both PMOS transistors.

5. The common-source differential power amplifier of claim 2, wherein each of the first bias circuit and the second bias circuit comprises a current source.

6. The common-source differential power amplifier of claim 2, wherein the first compensation transistor and the second compensation transistor are of the same parameter.

7. The common-source differential power amplifier of claim 1, wherein the at least one pair of driving transistors comprise a first driving transistor, a second driving transistor, a third driving transistor and a fourth driving transistor, both of the first driving transistor and the third driving transistor are disposed on one side of the compensation circuit, and both of the second driving transistor and the fourth pressing driving transistor are disposed on the other side of the compensation circuit, a gate of the first driving transistor and a gate of the second driving transistor are respectively connected to the two differential signal input terminals of the common-source differential power amplifier directly or through a capacitor, both of a source of the first driving transistor and a source of the second driving transistor are grounded, drains of the first driving transistor and the second driving transistor are connected to two differential signal output terminals of the common-source differential power amplifier, respectively, and the first driving transistor and the second driving transistor are both NMOS transistors, a gate of the third driving transistor and a gate of the fourth driving transistor are respectively connected to the two differential signal input terminals of the common-source differential power amplifier directly or through a capacitor, both of a source of the third driving transistor and a source of the fourth driving transistor are connected to a power supply terminal, drains of the third driving transistor and the fourth driving transistor are respectively connected to the two differential signal output terminals of the common-source differential power amplifier, and the third driving transistor and the fourth driving transistor are both PMOS transistors.

8. The common-source differential power amplifier of claim 7, wherein the first compensation transistor and the second compensation transistor in the same compensation circuit are both NMOS transistors or both PMOS transistors.

9. The common-source differential power amplifier of claim 7, wherein the first compensation transistor and the second compensation transistor in the same compensation circuit are of the same parameter.

10. The common-source differential power amplifier of claim 1, wherein, if the two signal terminals of the compensation circuit are respectively connected to the two differential signal input terminals of the common-source differential power amplifier through a capacitor, each of the two signal terminals of the compensation circuit is connected to a bias voltage terminal for providing an adjustable constant voltage through a resistor.

11. An electronic device, comprising a common-source differential power amplifier of claim 1.

* * * * *